United States Patent [19]
Rose et al.

[11] Patent Number: 5,414,393
[45] Date of Patent: May 9, 1995

[54] TELECOMMUNICATION CONNECTOR WITH FEEDBACK

[75] Inventors: William J. Rose, West Hartford; Robert Aekins, Stratford, both of Conn.

[73] Assignee: Hubbell Incorporated, Orange, Conn.

[21] Appl. No.: 2,871

[22] Filed: Jan. 15, 1993

Related U.S. Application Data

[63] Continuation-in-part of Ser. No. 932,194, Aug. 20, 1992.

[51] Int. Cl.⁶ .......................... H03H 7/00; H04M 1/74
[52] U.S. Cl. .............................................. 333/1; 333/5; 333/12; 379/332; 379/417; 439/607; 439/676; 439/894
[58] Field of Search ..................... 333/1, 12, 4, 5; 174/32–34; 307/89–91; 379/417, 332; 439/676, 607, 894.1

[56] References Cited

U.S. PATENT DOCUMENTS

| | | | |
|---|---|---|---|
| 2,943,272 | 6/1960 | Feldman | 333/12 |
| 3,496,555 | 2/1970 | Jones | 340/174 |
| 3,757,028 | 9/1973 | Schlessel | 174/33 |
| 3,891,815 | 6/1975 | Hiele | 200/175 |
| 4,367,908 | 1/1983 | Johnston | 439/676 |
| 4,413,469 | 11/1983 | Paquin | 57/273 |
| 4,481,379 | 11/1984 | Bolick | 174/117 |
| 4,689,441 | 8/1987 | Dick | 174/68.5 |
| 4,767,338 | 8/1988 | Dennis et al. | 439/55 |
| 4,785,135 | 11/1988 | Ecker | 174/34 |
| 4,831,497 | 5/1989 | Webster | 361/406 |
| 4,850,887 | 7/1989 | Sugawara | 439/108 |
| 5,039,824 | 8/1991 | Takashima | 174/33 |
| 5,186,647 | 2/1993 | Denkmann | 437/395 |
| 5,269,708 | 12/1993 | DeYoung | 439/676 |
| 5,295,869 | 3/1994 | Sieman et al. | 439/620 |
| 5,299,956 | 4/1994 | Brownell et al. | 439/676 X |

FOREIGN PATENT DOCUMENTS

| | | |
|---|---|---|
| 0525703 | 2/1983 | European Pat. Off. . |
| 1382013 | 1/1975 | United Kingdom . |
| 1440392 | 6/1976 | United Kingdom . |
| 1449209 | 9/1976 | United Kingdom . |
| 2089122 | 6/1983 | United Kingdom . |

OTHER PUBLICATIONS

Principles of Electricity Applied to Telephone and Telegraph Work, American Telephone and Telegraph Co., Jun. 1961.

*Primary Examiner*—Paul Gensler
*Attorney, Agent, or Firm*—Jerry M. Presson; Mark S. Bicks

[57] ABSTRACT

A connector for communications systems has four input terminals and four output terminals, each arranged in an ordered array. A circuit electrically couples each input terminal to the respective output terminal and cancels crosstalk induced across the adjacent connector terminals. The circuit includes four conductive paths between the respective pairs of terminals. Each conductive path includes a plurality of conductive strips arranged in a zig-zag pattern with alternating strips mounted on opposite sides of the substrate and connected end-to-end by conductive devices passing through the substrate. The first and third paths are in relatively close proximity with conductive strips of the first path crossing conductive strips of the third path on opposite sides of the substrate to simulate a twisted wiring pair. The second and fourth paths are in relatively close proximity with conductive strips of the second path crossing conductive strips of the fourth path on opposite sides of the substrate to simulate a twist wiring pair.

24 Claims, 2 Drawing Sheets

TELECOMMUNICATION CONNECTOR WITH FEEDBACK

REFERENCE TO RELATED APPLICATIONS

This application is a continuation-in part of U.S. patent application Ser. No. 07/932,194, filed on Aug. 20, 1992, in the name of Daniel E. Klas and William J. Rose and entitled Connector for Communication Systems with Cancelled Crosstalk; The application is also related to U.S. patent application Ser. No. 08/004,409, filed concurrently herewith in the name of John Gentry and entitled Modular Jack with Enhanced Crosstalk Performance. The subject matter of both applications is incorporated herein by reference.

FIELD OF THE INVENTION

The present invention relates to connectors for communication systems in which crosstalk induced between adjacent terminals of the connectors is cancelled. More particularly, the present invention relates to connectors with plural pairs of input and output terminals in which the respective input and output terminals are connected by conductive paths simulating twisted wiring pairs in a manner to cancel the effects of induced crosstalk.

BACKGROUND OF THE INVENTION

Due to advancements made in telecommunications and data transmission speeds (up to 100 MHz) over unshielded twisted pair cables, the connectors (jacks, patch panels, cross connects, etc.) have become a critical impediment to high performance data transmission at the higher frequencies, i.e., greater than 1 MHz. Some performance characteristics (particularly near end crosstalk) degrades beyond acceptable levels at these higher frequencies.

When an electrical signal is carried on a signal line which is in close proximity to another signal line or lines, such as in the case of adjacent pins or terminals in a connector, energy from one signal line can be coupled onto adjacent signal lines by means of the electric field generated by the potential between two signal lines and the magnetic field generated as a result of the changing electric fields. This coupling, whether capacitive or inductive, is called crosstalk when this phenomenon occurs between two or more signal lines.

Crosstalk is a noise signal and degrades the signal-to-noise margin (S/N) of a system. In communications systems, reduced S/N margin results in greater error rates in the information conveyed on a signal line.

One way to overcome this crosstalk problem is to increase the spacing between the signal lines. Another method commonly used is to shield the individual signal lines. However in many cases, the wiring is pre-existing and standards define the geometries and pin definitions for connectors making the necessary changes to such systems cost prohibitive. In the specific case of communications systems using unshielded twisted pair wiring, certain standards defining connector geometries and pinout definitions were created prior to the need for high speed data communications.

These standards have created a large installed base of wiring and connectors and a need for connectors capable of meeting the requirements of today's high speed communications, while maintaining compatibility with the original connectors. The standard connector geometries and pinouts are such that a great deal of crosstalk occurs at these higher signal frequencies.

According to Fourier's theory, when a signal is added to an equal but opposite signal, the two signals cancel each other completely. In unshielded twisted pair wiring, the two wires which are twisted about each other carry identical but opposite signals. These signals are described as being differentially driven. As one signal is driven toward a more positive voltage level, the second signal is driven in the opposite direction or toward a more negative voltage level. These signals being equal but opposite generate fields that are equal but opposite. These equal and opposite fields cancel each other with the result that little crosstalk can occur between a twisted pair and other adjacent signal lines.

In a typical connector used in unshielded twisted pair wiring systems, the signals are conveyed through connector pins or terminals which are parallel to each other for an inch or more, allowing unacceptable levels of crosstalk to occur for today's high speed data signals. These signals are typically in line with each other with the fields from one signal line being coupled onto the one or two immediately adjacent lines. If a noise signal equal, but opposite to, the crosstalk coupled signal is induced onto the affected line, the two induced signals thus coupled will cancel each other. Since the connector carries complementary pairs of signals (i.e. two differentially driven signals of a twisted pair wiring), noise coupled from one line of one pair onto an adjacent line can be canceled by also coupling an equal amount of "noise" from its complement.

SUMMARY OF THE INVENTION

An object of the present invention is to provide a connector for communication systems which will effectively cancel crosstalk induced across the connector terminals.

Another object of the present invention is to provide a connector without net crosstalk between the connector terminals without shielding and without changing the standard connector geometry and pinout definitions.

A further object of the present invention is to provide a connector without crosstalk between the connector terminals which is simple and inexpensive to manufacture and use.

The foregoing objects are basically obtained by a connector for communications systems, comprising first, second, third and fourth input terminals arranged in an ordered array, first, second, third and fourth output terminals arranged in an ordered array, and circuit means for electrically coupling each of the input terminals to the respective output terminal and for cancelling crosstalk induced across the adjacent connector terminals. The circuit means includes first, second, third and fourth conductive paths between the respective input and output terminals. Each conductive path includes a plurality of conductive strips arranged in a zig-zag pattern with alternating strips mounted on opposite sides of the substrate and connected end-to-end by conductive devices passing through the substrate. The first and third paths are in relatively close proximity with conductive strips of the first path crossing conductive strips of the third path on opposite sides of the substrate to simulate a twisted wiring pair. The second and fourth paths are in relatively close proximity with conductive strips of the second path crossing conductive strips of the fourth path on opposite sides of the substrate to simulate a twist wiring pair.

By forming the connector in this manner, the crosstalk noise is countered without requiring new equipment and wiring. Instead, the connector design itself simulates the twisting of wiring pairs to enhance elimination of the crosstalk noise, regardless of whether the induced crosstalk results from an inductive coupling by means of magnetic fields or from a capacitive coupling by means of electric fields, or from a combination of both couplings.

The crosstalk noise is eliminated by, for example, the energy induced onto the second signal line from the first signal line being approximately cancelled by coupling energy to the second signal line from a third signal line in close proximity to the second signal line and carrying a signal equal to, but opposite to, the signal in the first signal line. This operation is accomplished by crisscrossing the zig-zag conductive paths to allow signals to be run adjacent to each other in a controlled way. By adjusting the width of the conductive paths, the thicknesses of the paths, the separation of adjacent paths and the dielectric constant of the substrate, the amount of injected crosstalk can be adjusted to cancel that which was injected by the connector pins.

Other objects, advantages and salient features of the present invention will become apparent from the following detailed description, which, taken in conjunction with the annexed drawings, discloses preferred embodiments of the present invention.

BRIEF DESCRIPTION OF THE DRAWINGS

Referring to the drawings which form a part of this disclosure.

DETAILED DESCRIPTION OF THE INVENTION

Figure 1:
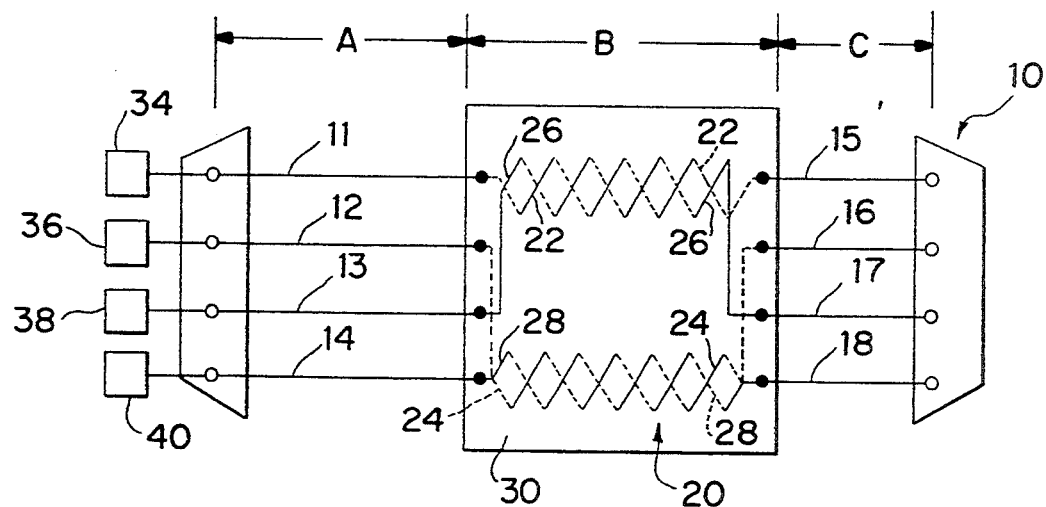
FIG. 1 is a schematic diagram of a connector for communication systems according to a first embodiment of the present invention.

A connector 10 according to the present invention is schematically or diagrammatically illustrated in FIG. 1, with the connector divided into an input section A, a circuit section B and an output section C. The circuit section electrically couples the connector input terminals 11, 12, 13 and 14 to the output terminals 15, 16, 17 and 18, respectively, such that crosstalk induced across adjacent terminals in input section A and output section C is cancelled in circuit section B.

The input and output terminals are of conventional designs used in telephone and other communications systems for such connectors as jacks, patch panels and cross connects. The conventional details of the connector in input section A and output section C are not described in detail. Suitable connectors are disclosed in the related Gentry patent application, identified hereinabove, as well as U.S. Pat. No. 4,648,678 to Archer and U.S. Pat. No. 5,061,209 to Bolick, the subject matter of each patent being incorporated herein by reference.

The circuit section B comprises a printed wiring board 20 with four printed circuit traces or conductive paths 22, 24, 26 and 28 printed on a substrate 30. Trace 22 extends between and connects input terminal 11 and output terminal 15. Trace 24 extends between and connects input terminal 12 and output terminal 16. Trace 26 extends between and connects input terminal 13 and output terminal 17. Trace 28 extends between an connects input terminal 14 and output terminal 18.

Each of the conductive paths includes a plurality of conductive strips arranged in a zig-zag pattern with alternating conductive strips on opposite sides of the substrate. The adjacent strips in each conductive path are printed on opposite sides of the circuit board substrate 30 and are connected at their adjacent ends by conductive members extending through the substrate. The conductive members comprise bores formed in the substrate which have been internally plated with conductive material. The conductive paths can be formed as disclosed in U.S. Pat. No. 3,757,028 to Schlessel and U.S. Pat. No. 5,039,824 to Takashima, which patents are incorporated herein by reference.

The conductive strips of first conductive path 22 are in relatively close proximity with the conductive strips of third conductive path 26, with the conductive strips of the first path overlying and crossing the conductive strips of third conductive path 26 on the opposite sides of the substrate to simulate a twisted wiring pair. The conductive strips of second conductive path 24 are in relatively close proximity to the conductive strips of fourth conductive path 28 to simulate another twisted wiring pair, substantially spaced from first conductive path 22 and third conductive path 26, In circuit board 20, traces 22 and 26 are in close proximity to each other inducing crosstalk therebetween, while traces 24 and 28 are in close proximity to each other inducing crosstalk therebetween. Traces 22 and 26 are substantially spaced from traces 24 and 28 to minimize induced crosstalk between such two pairs in circuit board 20.

In input section A and output section C, the proximity of adjacent terminals induces crosstalk between the adjacent terminals. Specifically, crosstalk is induced in terminal 11 from terminal 12, in terminal 12 from terminals 11 and 13, in terminal 13 from terminals 12 and 14, in terminal 14 from terminal 13, in terminal 15 from terminal 16, in terminal 16 from terminals 15 and 17, in terminal 17 from terminals 16 and 18, and in terminal 18 from terminal 17. The spacing between the terminals is adequate to minimize crosstalk between the other or non-adjacent terminal pairs.

In a communications system, terminals 11, 12, 13, and 14 are connected to signal sources 34, 36, 38 and 40, respectively. The signals from sources 34 and 40 are equal and opposite (i.e., differently driven) to each other. The signals from sources 36 and 38 are equal and opposite to each other. With the application of these two pairs of opposite or differently driven signals, the crosstalk induced in printed wiring board 20 in circuit section B tends to cancel the crosstalk induced across and between the respective input and output terminals in the input and output sections A and B of the connector.

The length and separation of traces 22, 26, 28 and 30, the thickness and width of each trace, the thickness of substrate 30, and the dielectric constant of the printed wiring board can be adjusted. With appropriate adjustment of those factors, the crosstalk signals induced between traces 22 and 26 and between traces 24 and 28 can be controlled to cancel, at least approximately, the effects of the induced signals or crosstalk resulting from the proximity of the terminals in input section A and output section C. The factors can also be adjusted to compensate for wiring crosstalk.

Although the schematic of FIG. 1 shows only two pairs of terminals and traces, any number of pairs can be provided.

In circuit board 20, trace 22 zig-zags across the board by being successively stitched first on one side of the board, then passing through to the other side of the board and repeating this pattern. Trace 26 begins on the top of the board and passes through the board to the bottom of the board after passing under trace 22. Trace 26 then zig-zags across the board in a manner similar to trace 22 successively crossing trace 22 but on the side of the board opposite trace 22 as shown in FIG. 1. This successive zig-zaging of traces 22 and 26 simulates twisted pair wiring and couples energy between the two signals being conducted on traces 22 and 26 in a very efficient manner.

As with traces 22 and 26, traces 24 and 28 zig-zag about each other on the board coupling energy between the two signals.

This technique allows a large amount of energy to be coupled between two signals on a small printed wiring board. It also allows the connector system (sections A, B and C) to better match the impedance of the twisted wire used to convey the signal to the connector. This reduces reflections of the signal at the connector which occur when a signal is transmitted from a medium with one impedance to a medium with a different impedance.

Figure 2:
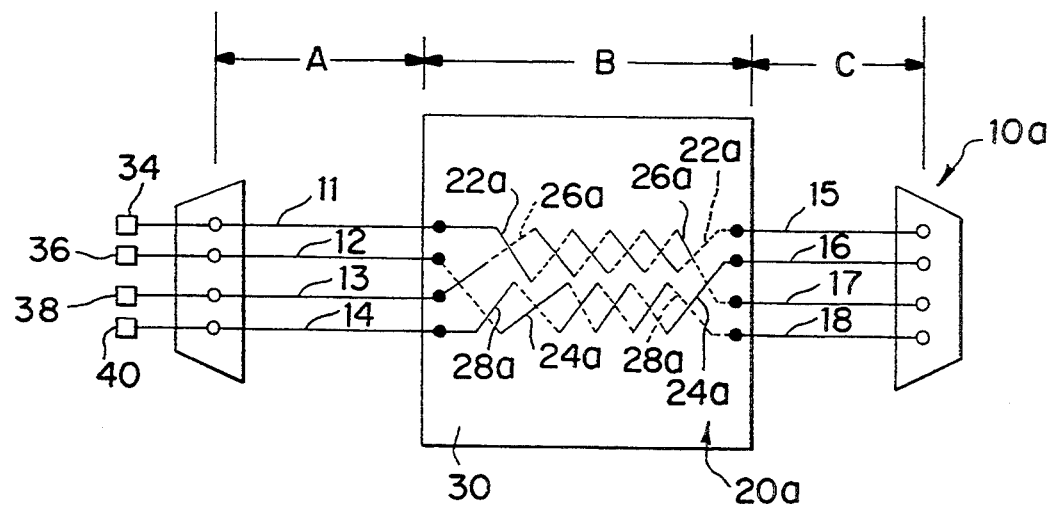
FIG. 2 is a schematic diagram of a connector for communication systems according to a second embodiment of the present invention.

FIG. 2 illustrates a second embodiment where features similar to FIG. 1 are identified with the same reference numbers.

The circuit section B comprises a printed wiring board 20a with four printed circuit traces or conductive paths 22a, 24a, 26a and 28a printed on a substrate 30. Trace 22a extends between and connects input terminal 11 and output terminal 15. Trace 24a extends between and connects input terminal 12 and output terminal 16. Trace 26a extends between and connects input terminal 13 and output terminal 17. Trace 28a extends between and connects input terminal 14 and output terminal 18. Traces 22a and 26a criss-cross. Traces 24a and 28a criss-cross.

In the second embodiment of FIG. 2, the two twisting pairs, traces 22a and 26a, and traces 24a and 28a, are shown closer to each other than in FIG. 1. By allowing the pairs of traces 22a/26a and 24a/28a to be in close proximity, and by controlling the points at which the two sets of twisted pairs make their closest approaches, some additional cancellation is gained. This can be seen by analyzing the total crosstalk situation. In section A of FIG. 2, there is crosstalk between all signals that are in relatively close proximity. The closer the conductors, the greater the crosstalk. For the purpose of this description, $22a \times 24a$ is defined as the crosstalk created by the signal of trace 24a onto trace 22a; and $24a \times 22a$ is the crosstalk from trace 22a onto trace 24a. Other crosstalk is defined as $22a \times 24a$, $24a \times 22a$, $24a \times 26a$, $28a \times 24a$, $26a \times 28a$, and $28a \times 26a$.

Since conductors 24a and 26a carry equal but opposite signals, these fields cancel leaving only $22a \times 24a$, $26a \times 28a$.

At the transition from section A to section B, the signals on conductors 22a, 24a, 26a, 28a are actually sums of the original signal plus the crosstalk signal from the contacts. That is to say:

$$22'a = 22a + 22a \times 24a$$

$$24'a = 24a + 24a \times 22a$$

$$26'a = 26a + 26a \times 28a$$

$$28'a = 28a + 28a \times 26a.$$

where $22'a$ is the total signal on conductor 22a. Since the signal component 22a on the right hand side of the equation for conductor 22a is the actual signal and not noise, it can be ignored for the purposes of calculating the crosstalk. The same can be done for the other conductors as well. These equations and the ones that follow are representative only. The actual crosstalk equations are far more complicated, and are not required for the purposes of this description.

In section B conductors 22a and 26a are twisted about each other as are conductors 24a and 28a. If the two pairs are brought into close proximity as shown in FIG. 2, then additional crosstalk is generated between the conductors that are in close proximity. In this case the crosstalk noise signal on conductor 22a is:

$$22'a = 22a \times 24a + (22a \times 26a)m + (22a \times 28a)n$$

where m is the magnitude of the crosstalk generated by the pair $22a \times 26a$ twisting about each other, and n is the magnitude of the crosstalk from the proximity of trace 22a to trace 28a. The values m and n are dependent upon the distance between the conductors, the thickness of the conductors, the dielectric of the material between them, and the distance the traces are in proximity to each other. In general, the closer the traces are to each other, and the longer they are in proximity to each other, the larger the values m and n are and hence the greater the coupling between them.

Substituting for 26a and 28a from above equation:

$$22a = 22a \times 24a + (22a \times (26a + 26a \times 28a)m + (22a \times (-28a \times 26a)n$$

or $$22a = 22a \times 24a + (22a \times 26a)m + 22a \times (26a \times 28a)m + (22a \times 28a)n + 22a \times (28a \times 26a)n$$

Since 22a and 28a are simply the same signal with opposite polarity, the crosstalk from trace 28a is not considered noise.

The equation above shows that additional crosstalk from the original signal on trace 26a has been coupled onto conductor 22a from the terms $(26a \times 28a)m$ and $(28a \times 26a)n$. This crosstalk noise from trace 26a has the effect of canceling some of the crosstalk noise from trace 24a as discussed above.

The benefit of the second embodiment is to allow smaller printed circuit boards to be made by gaining extra cancellation for a given length of traces on the board, first by twisting the trace 22a with trace 26a and trace 24a with trace 28a, and then by bringing the two sets of pairs close together in the manner shown above.

Figure 3:
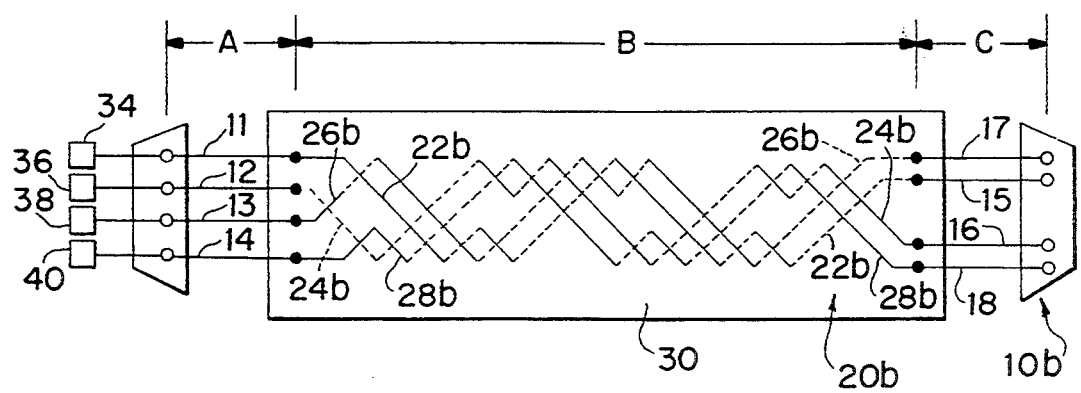
FIG. 3 is a schematic diagram of a connector for communication systems according to a third embodiment of the present invention.

FIG. 3 illustrates a third embodiment where features similar to FIG. 1 are identified with the same reference numbers.

An even greater effect can be gained by twisting the two sets of pairs about each other as shown in FIG. 3. This uses the effect demonstrated above whereby twisting signals increases the coupling effect. By twisting the two sets of pairs, the secondary coupling effect is increased. The benefit obtained is greater coupling in less space, thereby reducing the size of the printed circuit board. By reducing the size of the board, a smaller connector can be made which increases the number of connectors that can be packaged together in a given area such as in a patch panel, where many connectors must be packaged together in a small area.

The circuit section B of FIG. 3 comprises a printed wiring board 20b with four printed circuit traces or conductive paths 22b, 24b, 26b and 28b printed on a substrate 30. Trace 22b extends between and connects input terminal 11 and output terminal 15. Trace 24b extends between and connects input terminal 12 and output terminal 16. Trace 26b extends between and connects input terminal 13 and output terminal 17. Trace 28b extends between an connects input terminal 14 and output terminal 18. Traces 22b and 26b crisscross or twist with each other. Traces 24b and 28b crisscross or twist with each other. Additionally, the pair of traces 22b and 26b criss-cross or twist with the pair of traces 24b and 28b.

Figure 4:
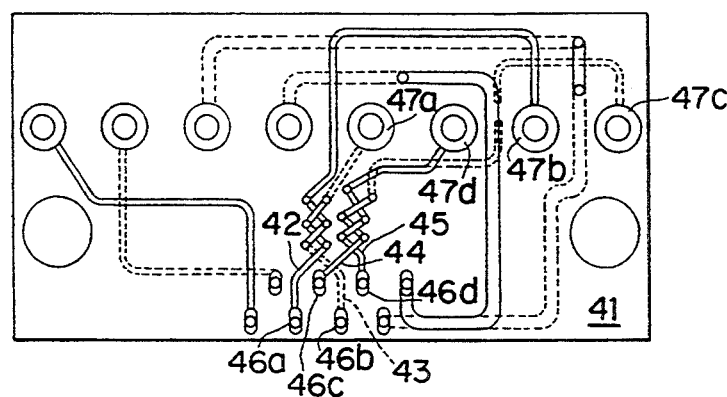
FIG. 4 is a plan view of a printed wiring board of a connector according to the second embodiment of the present invention.

FIG. 4 illustrates a printed wiring board embodying the second embodiment at the present invention. Substrate 41 has twisted conductive traces 42 and 43 and twisted conductive traces 44 and 45 extending between terminal connection points 46 a-d and 47 a-d. Trace 42 extends between points 46a and 47a. Trace 43 extends between points 46b and 47b. Trace 44 extends between points 46c and 47c. Trace 45 extends between points 46d and 47d. Additional conductors connect the respective pairs of the other terminal connector points.

Figure 5:
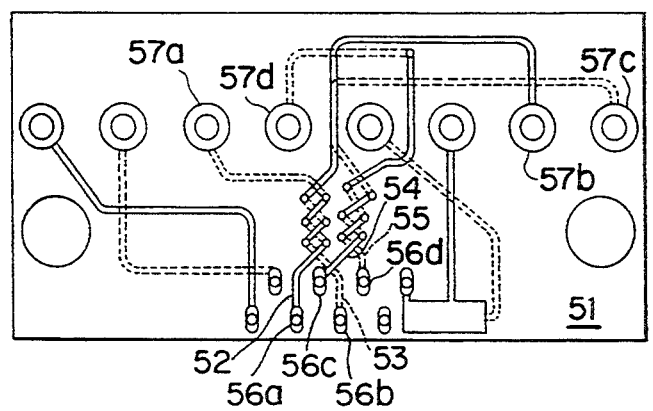
FIG. 5 is a plan view of another printed wiring board of a connector according to the second embodiment of the present invention.

FIG. 5 illustrates another printed wiring board embodying the second embodiment. Substrate 51 has twisted conductive traces 52 and 53 and twisted conductive traces 54 and 55 extending between terminal connection points 56 a-d and 57 a-d. Trace 52 extends between points 56a and 57a. Trace 53 extends between points 56b and 57b. Trace 54 extends between points 56c and 57c. Trace 55 extends between points 56d and 57d. Additional conductors connect the respective pairs of the other terminal connection points.

While various embodiments have been chosen to illustrate the invention, it will be understood by those skilled in the art that various changes and modifications can be made therein without departing from the scope of the invention as defined in the appended claims.

What is claimed is:

1. A connector for communications systems, comprising:
    first, second, third and fourth input terminals arranged in a first ordered array;
    first, second, third and fourth output terminals arranged in a second ordered array; and
    circuit means, formed on a substrate, for electrically coupling each of said input terminals to the respective output terminal and for canceling crosstalk induced across adjacent ones of said terminals, said circuit means including first, second, third and fourth conductive paths between the respective pairs of terminals, each of said conductive paths having a section including a plurality of conductive strips arranged in a zig-zag pattern with alternating strips thereof mounted on opposite sides of said substrate and connected end-to-end by conductive means passing through said substrate, said first and third paths being in relatively close proximity with said conductive strips of said first path crossing said conductive strips of said third path on opposite sides of said substrate to simulate a twisted wiring pair, said second and fourth paths being in relatively close proximity with said conductive strips of said second path crossing said conductive strips of said fourth path on opposite sides of said substrate to simulate another twisted wiring pair.

2. A connector according to claim 1 wherein said sections of said first and third paths are substantially spaced from said sections of said second and fourth paths.

3. A connector according to claim 1 wherein said circuit means comprises a printed wiring board with printed conductive traces forming said conductive strips.

4. A connector according to claim 1 wherein said sections of said first and third paths are adjacent said sections of said second and fourth paths to permit additional generation of crosstalk between said conductive paths.

5. A connector according to claim 4 wherein said conductive strips of said first and third paths do not cross said conductive strips of said second and fourth paths.

6. A connector according to claim 1 wherein said conductive strips of said first and third paths cross said conductive strips of said second and fourth paths on opposite sides of said substrate to simulate a twisting of two pairs of wires.

7. A connector according to claim 1 wherein said first and fourth input terminals are respectively coupled to sources of equal and opposite signals.

8. A connector according to claim 7 wherein said second and third input terminals are respectively coupled to sources of equal and opposite signals.

9. A connector according to claim 1 wherein said conductive paths have lengths and widths and are relatively spaced such that induced crosstalk is approximately cancelled.

10. A connector for communications systems, comprising:
    first, second, third and fourth input terminals arranged in a first ordered array;
    first, second, third and fourth output terminals arranged in a second ordered array; and
    printed wiring board means for electrically coupling each of said input terminals to the respective output terminal, said board means including a substrate having first, second, third and fourth conductive paths printed thereon between the respective pairs of terminals, each of said conductive paths having a section including a plurality of conductive strips arranged in a zig-zag pattern with alternating strips thereof mounted on opposite sides of said substrate and connected end-to-end by conductive means passing through said substrate, said first and third paths being in relatively close proximity with said conductive strips of said first path crossing said conductive strips of said third path on opposite sides of said substrate to simulate a twisted wiring pair, said second and fourth paths being in relatively close proximity with said conductive strips of said second path crossing said conductive strips of said fourth path on opposite sides of said substrate to simulate another twist wiring pair;

said conductive paths having lengths and widths and being relatively spaced on said substrate, and said substrate having a dielectric constant such that any induced crosstalk is approximately cancelled.

11. A connector according to claim 10 wherein said sections of said first and third paths are substantially spaced from said sections of said second and fourth paths.

12. A connector according to claim 10 wherein said sections of said first and third paths are adjacent said sections of said second and fourth paths to permit additional generation of crosstalk between and conductive paths.

13. A connector according to claim 12 wherein said conductive strips of said first and third paths do not cross said conductive strips of said second and fourth paths.

14. A connector according to claim 10 wherein said conductive strips of said first and third paths cross said conductive strips of said second and fourth paths on opposite sides of said substrate to simulate a twisting of two pairs of wires.

15. A connector according to claim 1 wherein
said second and third input terminals are between said first and fourth input terminals; and
said second and third paths are in relatively close proximity at connections thereof with said second and third input terminals and crossing over each other between said input terminals and said output terminals.

16. A connector according to claim 15 wherein
the first ordered array is in the same order as the second ordered array.

17. A connector according to claim 15 wherein
distances between said sections of said first and third paths and between said sections of said second and fourth paths are substantially less than distances of said sections of said first and third paths from said sections of said second and fourth paths.

18. A connector according to claim 15 wherein
said first and fourth input terminals form a first signal conducting pair; and
said second and third input terminals form a second signal conductive pair.

19. A connector according to claim 15 wherein
said second and third paths cross at a point between said first and fourth paths.

20. A connector according to claim 10 wherein
said second and third input terminals are between said first and fourth input terminals; and
said second and third paths are in relatively close proximity at connections thereof with said second and third input terminals and crossing over each other between said input terminals and said output terminals.

21. A connector according to claim 20 wherein
the first ordered array is in the same order as the second ordered array.

22. A connector according to claim 20 wherein
distances between said sections of said first and third paths and between said sections of said second and fourth paths are substantially less than distances of said sections of said first and third paths from said sections of second and fourth paths.

23. A connector according to claim 20 wherein
said first and fourth input terminals form a first signal conducting pair; and
said second and third input terminals form a second signal conductive pair.

24. A connector according to claim 20 wherein
said second and third paths cross at a point between said first and fourth paths.

* * * * *